United States Patent
Lee et al.

(10) Patent No.: US 11,915,777 B2
(45) Date of Patent: *Feb. 27, 2024

(54) INTEGRATED ASSEMBLIES AND METHODS FORMING INTEGRATED ASSEMBLIES

(71) Applicant: Micron Technology, Inc., Boise, ID (US)

(72) Inventors: Che-Chi Lee, Boise, ID (US); Terrence B. McDaniel, Boise, ID (US); Kehao Zhang, Boise, ID (US); Albert P. Chan, Boise, ID (US); Clement Jacob, Boise, ID (US); Luca Fumagalli, Boise, ID (US); Vinay Nair, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

This patent is subject to a terminal disclaimer.

(21) Appl. No.: 17/669,189

(22) Filed: Feb. 10, 2022

(65) Prior Publication Data

US 2022/0358971 A1    Nov. 10, 2022

Related U.S. Application Data

(63) Continuation of application No. 17/307,686, filed on May 4, 2021, now Pat. No. 11,282,548.

(51) Int. Cl.
*G11C 11/24* (2006.01)
*G11C 5/10* (2006.01)
(Continued)

(52) U.S. Cl.
CPC .............. *G11C 5/10* (2013.01); *G11C 11/405* (2013.01); *H01L 27/0688* (2013.01); *H01L 28/60* (2013.01); *H10B 12/30* (2023.02)

(58) Field of Classification Search
CPC .......... G11C 5/10; G11C 11/405; H10B 12/30; H10B 28/60; H01L 27/0688; H01L 28/60
(Continued)

(56) References Cited

U.S. PATENT DOCUMENTS 7,903,449 B2 * 3/2011 Kajigaya ............. G11C 11/4099
365/210.15
11,164,872 B1 * 11/2021 Pulugurtha ............ H10B 12/05
(Continued)

FOREIGN PATENT DOCUMENTS

CN    113851477 A  * 12/2021  ....... H01L 27/10808

OTHER PUBLICATIONS

Lee et al., U.S. Appl. No. 17/079,745, filed Oct. 26, 2020, titled "Vertical Digit Lines for Semiconductor Devices", 125 pages.
(Continued)

*Primary Examiner* — Viet Q Nguyen
(74) *Attorney, Agent, or Firm* — Wells St. John P.S.

(57) ABSTRACT

Some embodiments include an integrated assembly having first and second source/drain regions laterally offset from one another. Metal silicide is adjacent to lateral surfaces of the source/drain regions. Metal is adjacent to the metal silicide. Container-shaped first and second capacitor electrodes are coupled to the source/drain regions through the metal silicide and the metal. Capacitor dielectric material lines interior surfaces of the container-shaped first and second capacitor electrodes, A shared capacitor electrode extends vertically between the first and second capacitor electrodes, and extends into the lined first and second capacitor electrodes. Some embodiments include methods of forming integrated assemblies.

21 Claims, 15 Drawing Sheets

(51) Int. Cl.
*H01L 49/02* (2006.01)
*G11C 11/405* (2006.01)
*H01L 27/06* (2006.01)
*H10B 12/00* (2023.01)

(58) Field of Classification Search
USPC .......................................................... 365/149
See application file for complete search history.

(56) References Cited

U.S. PATENT DOCUMENTS

| | | | |
|---|---|---|---|
| 11,227,864 B1 * | 1/2022 | Saeedi Vahdat | ......... H01L 29/24 |
| 11,239,117 B1 * | 2/2022 | Saeedi Vahdat | ..... H10B 12/488 |
| 11,257,821 B1 * | 2/2022 | Lee | ........................ H10B 12/03 |
| 11,282,548 B1 * | 3/2022 | Lee | ........................ H01L 28/60 |
| 11,289,491 B1 * | 3/2022 | Saeedi Vahdat | ....... H10B 12/05 |
| 11,309,315 B2 * | 4/2022 | McDaniel | .............. H10B 12/30 |
| 11,329,051 B2 * | 5/2022 | Smythe, III | ............ H10B 12/30 |
| 11,367,726 B2 * | 6/2022 | Lee | ..................... H10B 12/056 |
| 11,393,820 B2 * | 7/2022 | Lee | ....................... H10B 12/482 |
| 11,450,693 B2 * | 9/2022 | Liu | ................... H01L 21/02639 |
| 11,476,251 B2 * | 10/2022 | Sills | .................... H01L 29/7869 |
| 11,476,254 B2 * | 10/2022 | Yokoyama | ............. H10B 61/22 |
| 11,495,604 B2 * | 11/2022 | Lee | ........................ H10B 12/05 |
| 11,532,630 B2 * | 12/2022 | Karda | ................... H10B 12/482 |
| 11,538,809 B2 * | 12/2022 | Karda | .................... H10B 12/05 |
| 11,563,011 B2 * | 1/2023 | Nair | ...................... H10B 12/31 |
| 11,641,732 B2 * | 5/2023 | Yang | ....................... H10B 63/84 |
| | | | 257/296 |
| 2014/0167220 A1 | 6/2014 | Ramsbey | |
| 2022/0037324 A1 | 2/2022 | Lee | |
| 2022/0335982 A1 * | 10/2022 | He | ...................... G11C 11/4097 |

OTHER PUBLICATIONS

Yokoyama, U.S. Appl. No. 17/228,411, filed Apr. 12, 2021, titled "Capacitive Units and Methods of Forming Capacitive Units", 55 pages.

* cited by examiner

INTEGRATED ASSEMBLIES AND METHODS FORMING INTEGRATED ASSEMBLIES

RELATED PATENT DATA

This patent resulted from a continuation application of U.S. patent application Ser. No. 17/307,686, filed May 4, 2021, the disclosures of which are incorporated herein by reference.

TECHNICAL FIELD

Integrated assemblies (e.g., integrated memory). Methods of forming integrated assemblies.

BACKGROUND

Integrated assemblies may include memory. An example memory configuration 1200 is shown in FIG. 1. Transistors (access devices) 1206 include horizontally-extending segments of semiconductor material 1204, with such segments including source/drain regions 1238 and 1240, and including channel regions 1242. Capacitors 1208 are coupled with the transistors 1206 through conductive interconnects 1244. In some applications, the conductive interconnects may be considered to be part of the capacitors, and may, for example, be considered to be part of the storage nodes of such capacitors.

Memory cells 1210 comprise the transistors 1206 and the capacitors 1208. The memory cells are arranged within the memory configuration (memory array) 1200, with such array having rows 1224 extending along an illustrated z-axis direction, and having columns 1246 extending along an illustrated x-axis direction. Digit lines 1212 extend along the columns 1246, and are coupled with the source/drain regions 1238 of the transistors 1206. Wordlines 1214 extend along the rows 1224 of the memory array, and are adjacent to the channel regions 1242 of the transistors 1206. In the illustrated embodiment, each of the wordlines comprises two segments, with such segments being on opposing sides of the channel regions 1242. In other embodiments, the wordlines may comprise other suitable configurations, and may, for example, comprise only a single component on one side of a channel region, may comprise gate-all-around configurations, etc.

The wordlines 1214 are generally spaced from the channel regions 1242 by gate dielectric material (e.g., silicon dioxide), but such gate dielectric material is not shown in FIG. 1 in order to simplify the drawing.

The body regions (channel regions) 1242 of the transistors 1206 are coupled with a conductive plate 1248. Such plate may be utilized to enable excess carriers (e.g., holes) to drain from the body regions 1242 during some operational modes of the memory cells 1210.

FIG. 2 shows a cross-sectional side view of the assembly 1200 of FIG. 1 along the y-axis direction, and diagrammatically illustrates some of the structures described above with reference to FIG. 1. The transistors 1206 are shown to extend horizontally along the y-axis direction. The wordlines 1214 are shown to extend vertically along the z-axis direction, and the digit lines 1212 are shown to extend horizontally in and out of the page relative to the cross-sectional view of FIG. 2. The conductive plates 1248 (FIG. 1) are not shown in FIG. 2 in order to simplify the drawing.

The capacitors 1208 of laterally neighboring memory cells 1210 are shown to share a plate electrode 1250 in the memory configuration 1200 of FIG. 2.

A base 1216 supports components of the memory configuration 1200. Such base may comprise semiconductor material; and may, for example, comprise, consist essentially of, or consist of monocrystalline silicon. The base 1216 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 1216 may correspond to a semiconductor substrate containing one or more materials associated with integrated circuit fabrication. Such materials may include, for example, one or more of refractory metal materials, barrier materials, diffusion materials, insulator materials, etc.

Another example memory configuration 1300 is shown in FIG. 3. Transistors (access devices) 1306 include horizontally-extending segments of semiconductor material 1304, with such segments including source/drain regions 1338 and 1340, and including channel regions 1342. Capacitors 1308 are coupled with the transistors 1306 through conductive interconnects 1344. In some applications, the conductive interconnects may be considered to be part of the capacitors, and may, for example, be considered to be part of the storage nodes of such capacitors.

Memory cells 1310 comprise the transistors 1306 and the capacitors 1308. The memory cells are arranged within the memory configuration (memory array) 1300. Digit lines 1312 extend along columns of the memory array and are coupled with the source/drain regions 1338 of the transistors 1306. The digit lines extend vertically along a z-axis direction.

Wordlines 1314 extend along the rows of the memory array, and are adjacent to the channel regions 1342 of the transistors 1306. The wordlines 1314 are spaced from the channel regions 1342 by gate dielectric material 1305.

The body regions (channel regions) 1342 of the transistors 1306 are coupled with a conductive plate 1348. Such plate may be utilized to enable excess carriers (e.g., holes) to drain from the body regions 1342 during some operational modes of the memory cells 1310.

FIG. 4 shows a cross-sectional side view of the assembly 1300 of FIG. 3 along the x-axis direction, and diagrammatically illustrates some of the structures described above with reference to FIG. 3. The transistors 1306 are shown to extend horizontally along the x-axis direction. The digit lines 1312 are shown to extend vertically along the z-axis direction, and the wordlines 1314 are shown to extend horizontally in and out of the page relative to the cross-sectional view of FIG. 4.

The capacitors 1308 of laterally neighboring memory cells 1310 are shown to share a plate electrode 1350.

The illustrated components of the memory configuration 1300 are shown to be supported by a base 1316. Such base may be a semiconductor substrate.

The memory shown in FIGS. 1-4 utilizes laterally-extending capacitors coupled with source/drain regions of access devices. It can be difficult to achieve high-conductivity coupling between laterally-extending capacitors and source/drain regions of access devices. Accordingly, it is desired to develop new architectures having good electrical coupling between source/drain regions and laterally-extending capacitors, and it is desired to develop methods of forming the new architectures.

DETAILED DESCRIPTION OF THE ILLUSTRATED EMBODIMENTS

Some embodiments include architectures which provide metal/metal silicide conductive bridges between capacitor electrodes of laterally-extending capacitors and source/drain regions of access devices (e.g., access transistors) to enable high-conductivity connections between the source/drain regions and the capacitor electrodes. Memory cells may comprise the access devices and the capacitors. The memory cells may be, for example, dynamic random-access memory (DRAM) cells, and may be utilized in highly-integrated memory arrays. Example embodiments are described with reference to FIGS. 5-15.

Figure 1:
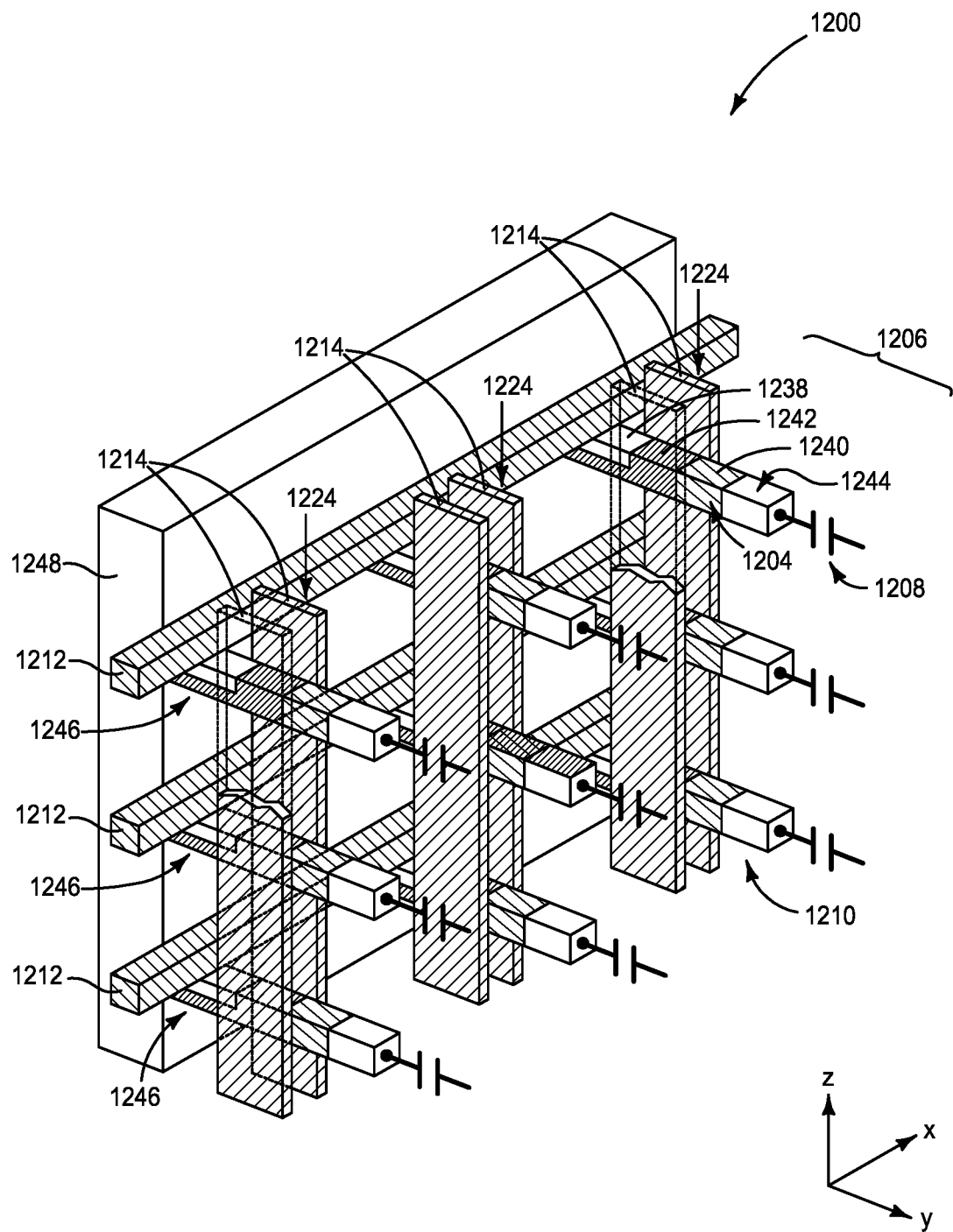
FIG. 1 is a diagrammatic three-dimensional view of a region of a prior art integrated assembly.
Figure 2:
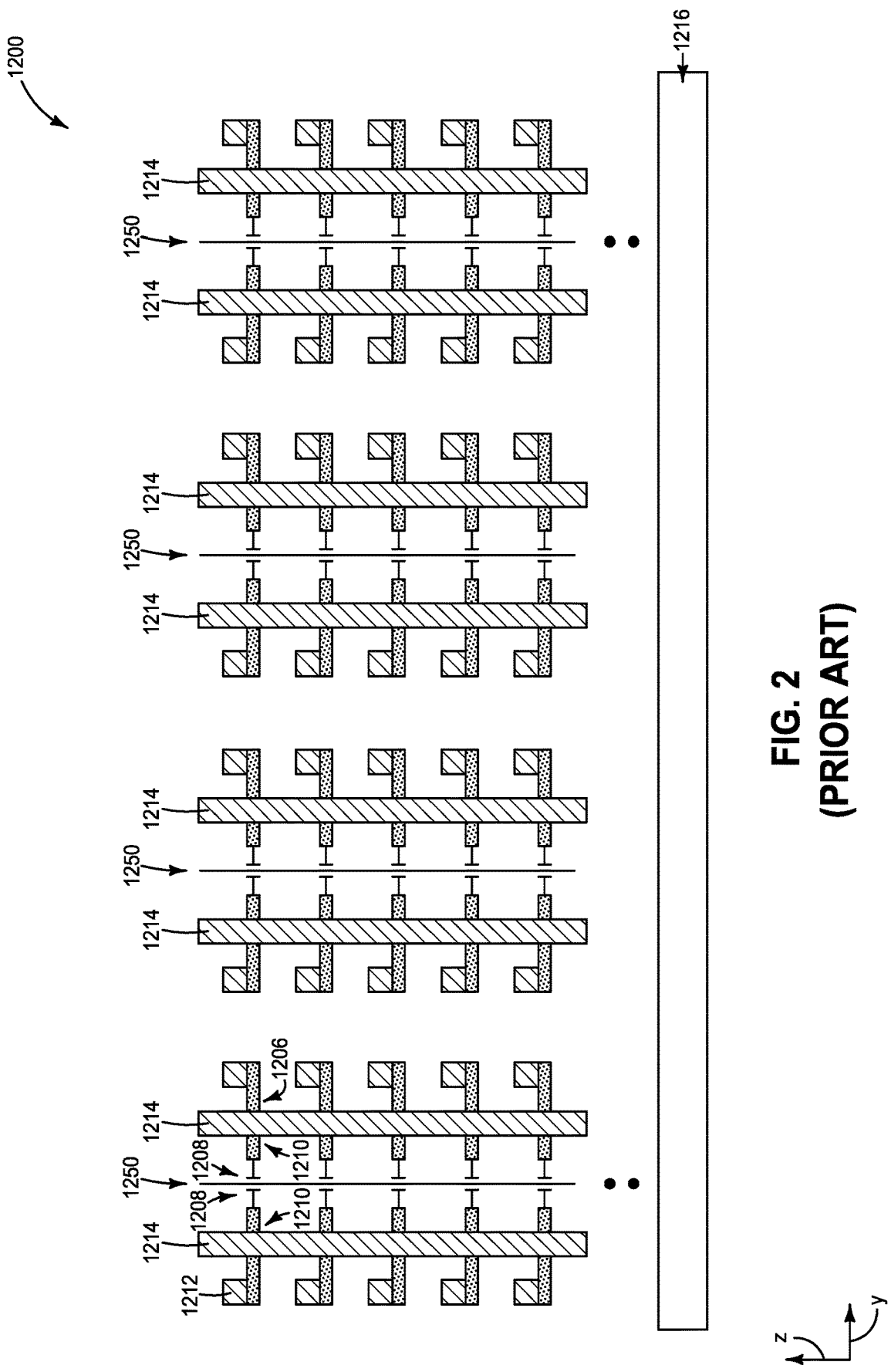
FIG. 2 is a diagrammatic cross-sectional side view of a region of a prior art assembly analogous to that of FIG. 1.
Figure 3:
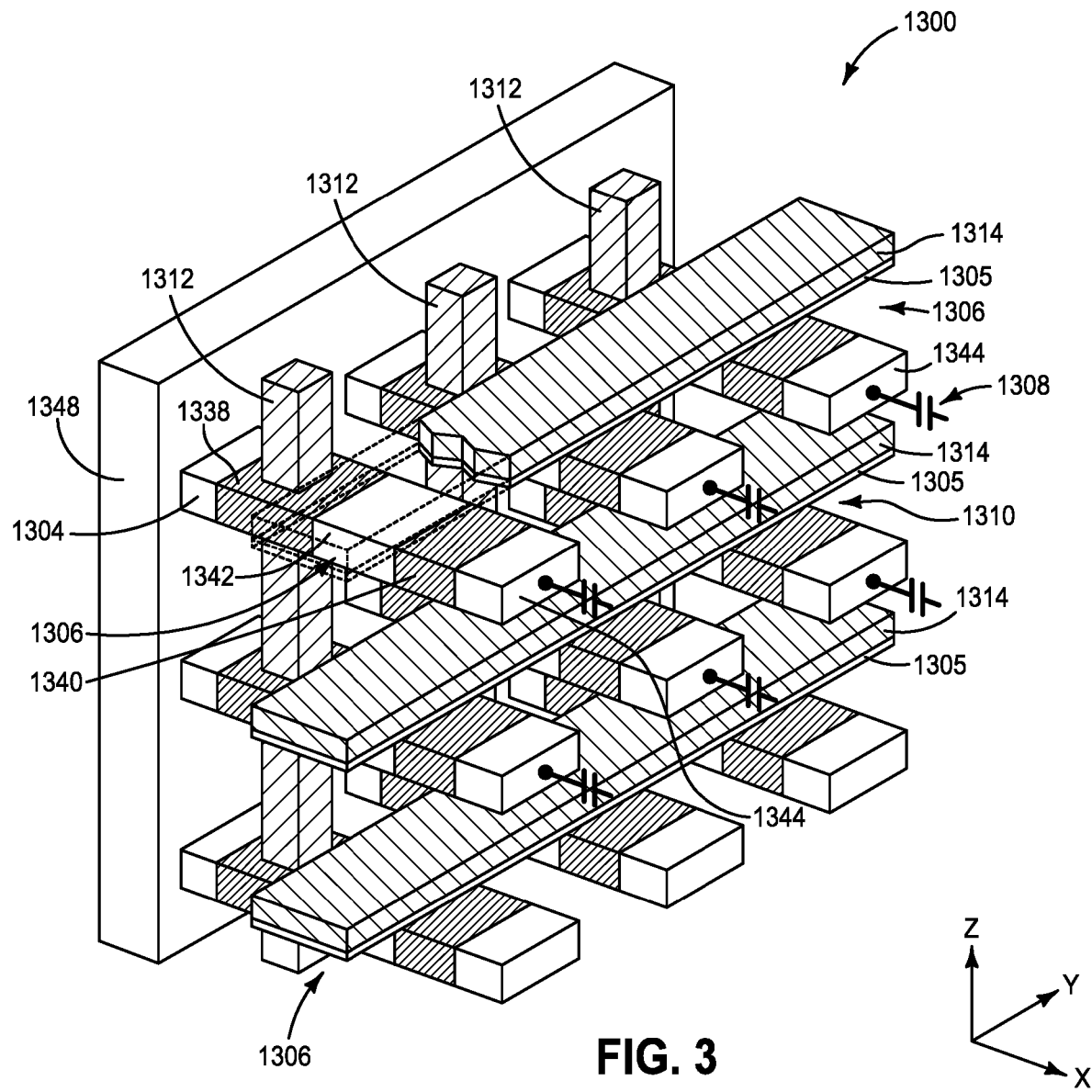
FIG. 3 is a diagrammatic three-dimensional view of a region of a prior art integrated assembly.
Figure 4:
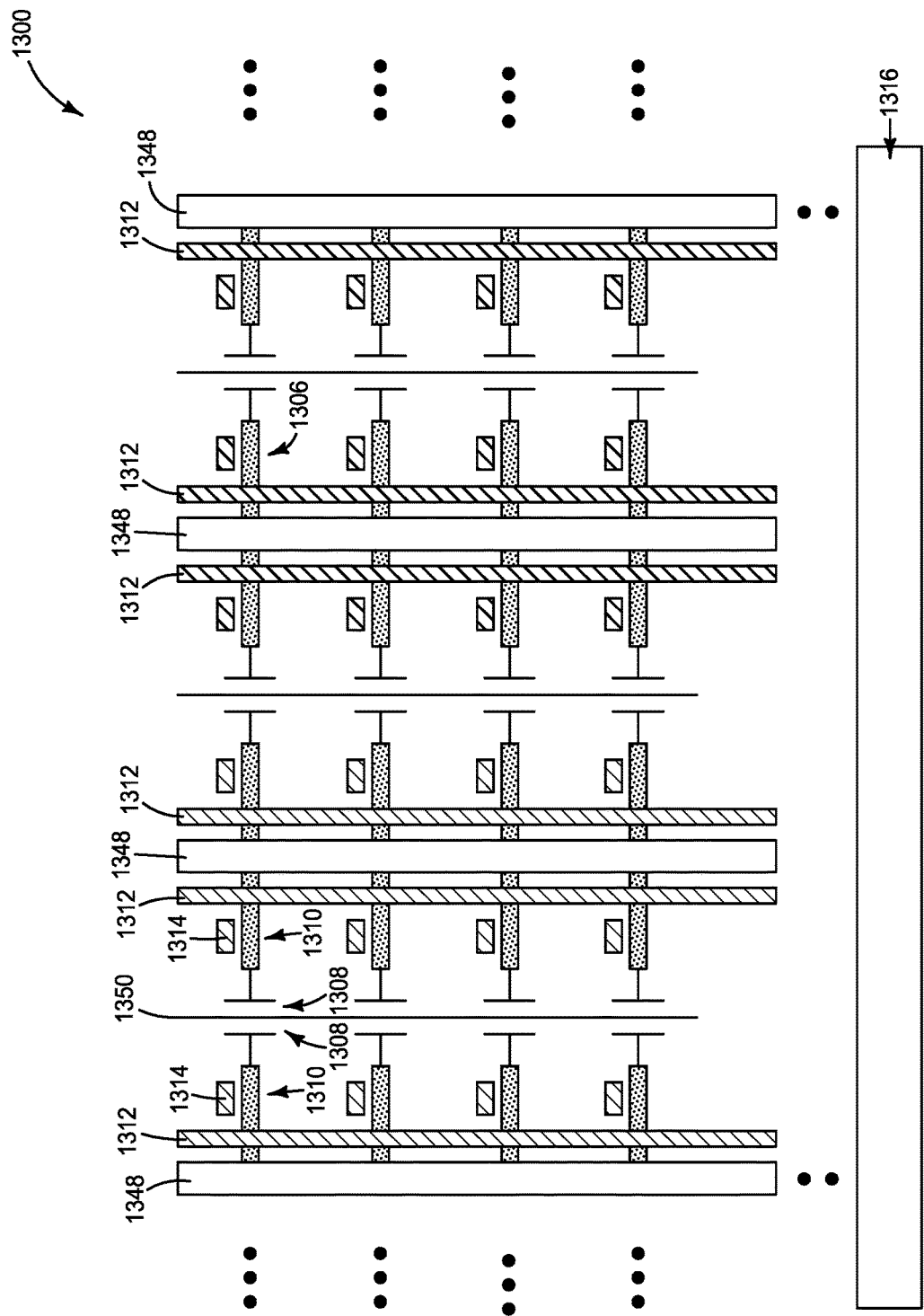
FIG. 4 is a diagrammatic cross-sectional side view of a region of a prior art assembly analogous to that of FIG. 3.
Figure 5:
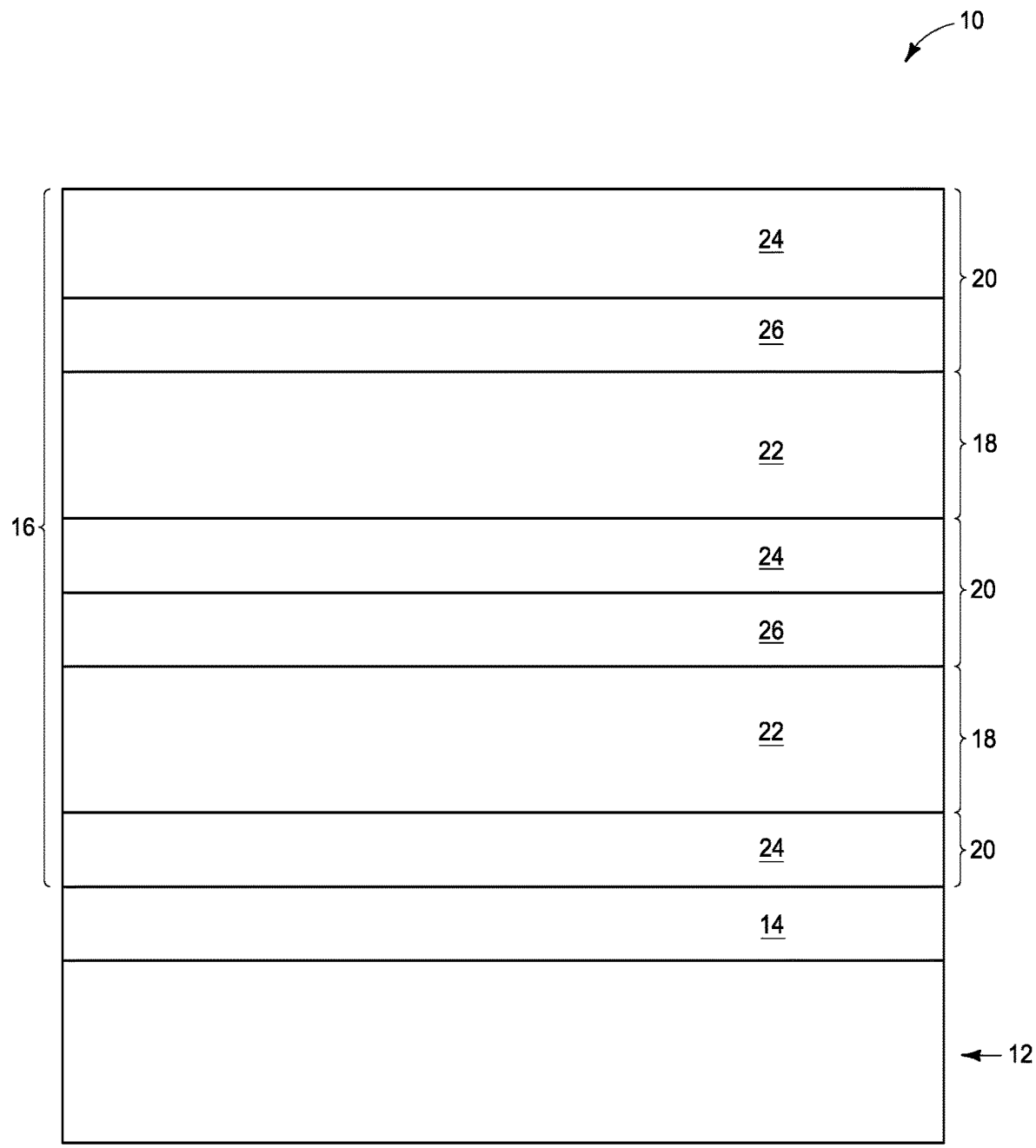
FIGS. 5-15 are diagrammatic cross-sectional side views of an example region of an example integrated assembly at example process stages of an example method.

Referring to FIG. 5, an integrated assembly 10 includes a base 12 and a material 14 over the base. The base 12 may comprise semiconductor material, and may, for example, comprise, consist essentially of, or consist of monocrystalline silicon. The base 12 may be referred to as a semiconductor substrate.

The material 14 may be an insulative etch-stop material, and may comprise any suitable composition(s). In some embodiments, the material 14 may comprise a metal oxide. In some embodiments, the material 14 may comprise, consist essentially of, or consist $ZrO_x$, where x is a number. In some embodiments, the $ZrO_x$ may be referred to as zirconium oxide.

A stack 16 is formed over the material 14. The stack 16 comprises alternating first and second levels 18 and 20. The first levels 18 comprise semiconductor material 22, and the second levels 20 comprise insulative material. In the illustrated embodiment, the insulative material within at least some of the second levels 20 includes a first composition 24 and a second composition 26. The levels 20 may include one or both of the compositions 24 and 26. In some embodiments, the composition 24 may comprise, consist essentially of, or consist of silicon dioxide. In some embodiments, the composition 26 may comprise, consist essentially of, or consist of silicon nitride. In some embodiments, the levels 20 may comprise one or more insulative compositions in addition to, or alternatively to, one or both of the indicated compositions 24 and 26.

The semiconductor material 22 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 22 may comprise, consist essentially of, or consist of silicon.

The semiconductor material 22 may correspond to channel material analogous to that described above with reference to FIGS. 1-4 as the materials 1242 and 1342. In such embodiments, the configuration of FIG. 5 may correspond to a process stage utilized to fabricate memory analogous to any of the memory described above with reference to FIGS. 1-4. Accordingly, vertically-extending digit lines or vertically-extending wordlines may be proximate to the illustrated region of the assembly 10 of FIG. 5.

Eventually, laterally-extending capacitors are formed along the levels 18, and such capacitors may be analogous to the capacitors 1208 and 1308 of FIGS. 1-4. Accordingly, the capacitors may be incorporated into memory cells of a three-dimensional memory array. Although the embodiment of FIG. 5 shows the stack 16 comprising two of the levels 18, it is to be understood that in some embodiments the stack 16 may comprise a large number of the vertically-stacked levels 18; and may, for example, comprise eight of the vertically-stacked levels 18, 16 of the vertically-stacked levels 18, 32 of the vertically-stacked levels 18, 64 of the vertically-stacked levels 18, 128 of the vertically-stacked levels 18, 256 of the vertically-stacked levels 18, 512 of the vertically-stacked levels 18, etc.

The insulative material 24 is illustrated as an uppermost material of the assembly 10. It is to be understood that other materials (e.g., photolithographically-patterned photoresist, hard masking materials, antireflective materials, etc.) may be provided over the stack 16 during the patterning of openings (described below). Such other materials are not shown in order to simplify the drawings.

Figure 6:
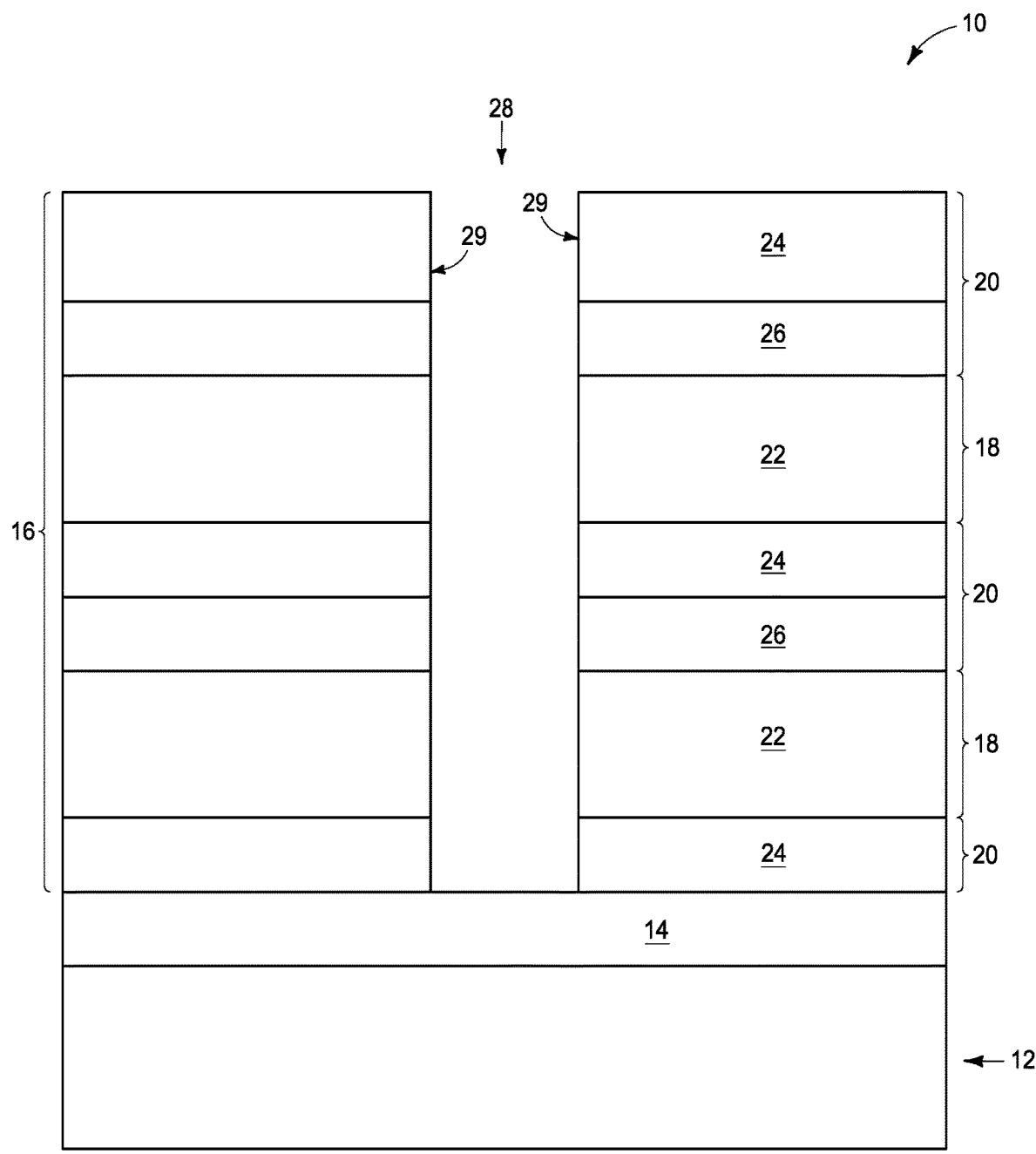

Referring to FIG. 6, an opening 28 is formed to extend through the stack 16. In the shown embodiment, the opening stops an upper surface of the etch-stop material 14. In other embodiments, the opening may penetrate into the etch-stop material 14.

The illustrated opening 28 may be a longitudinally-extending trench (with such trench extending in and out of the page relative to the cross-sectional view of FIG. 6), and the trench may be representative of a large number of substantially identical trenches formed through the stack 16 during the patterning of three-dimensional memory (e.g., memory analogous to any of that described above with reference to FIGS. 1-4).

The opening 28 has sidewalls 29 that extend along the materials 22, 24 and 26 of the levels 18 and 20.

Figure 7:
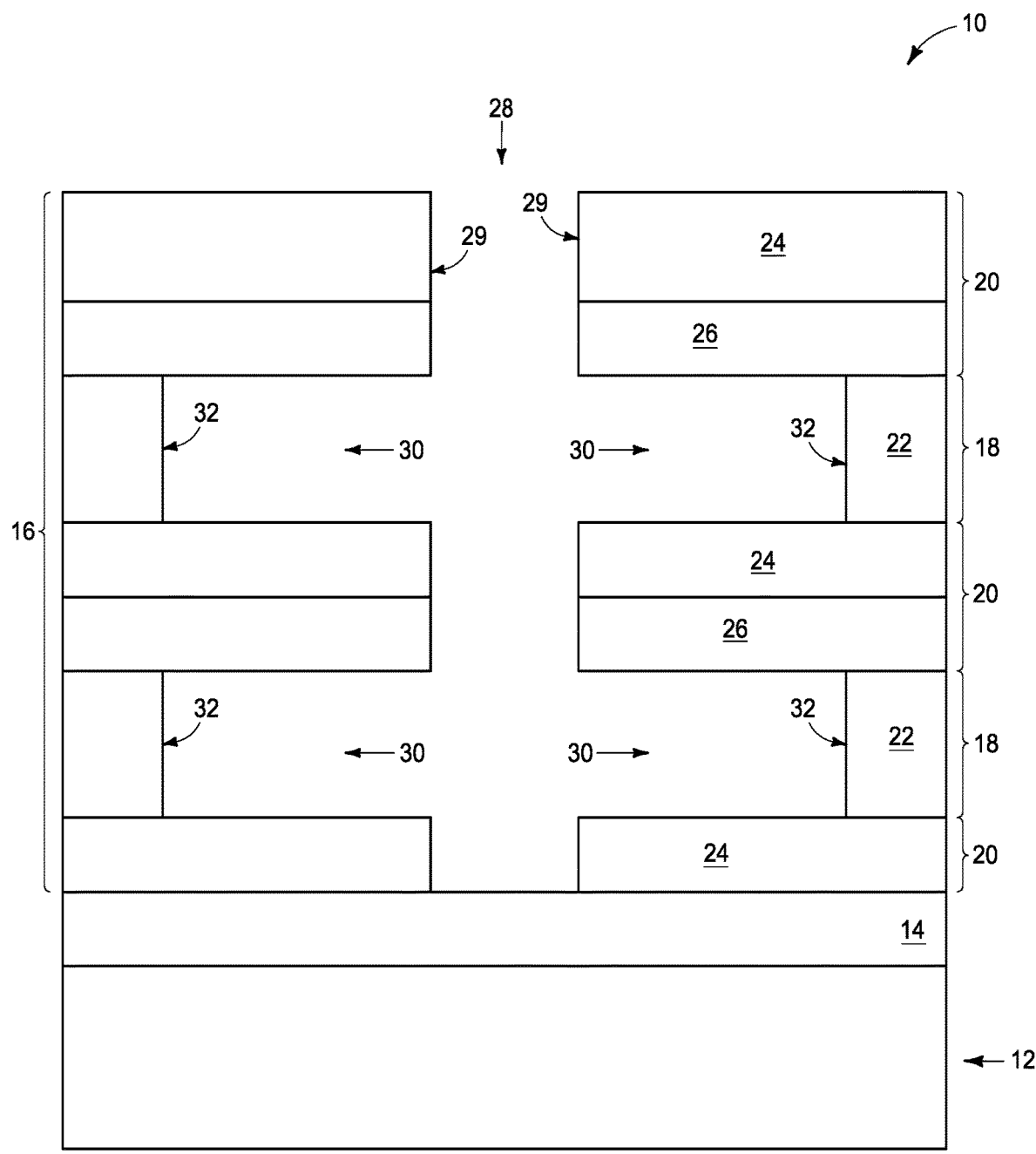

Referring to FIG. 7, the semiconductor material (channel material) 22 is recessed from the sidewalls 29 of the opening 28 to form cavities 30 extending laterally outwardly from the opening. In some embodiments, the laterally-extending cavities 30 may be considered to be adjacent to the opening 28.

The cavities 30 may be formed with any suitable processing. In some embodiments, the material 22 may comprise silicon, and the cavities may be formed utilizing an etchant comprising tetramethylammonium hydroxide (TMAH).

Only some of the semiconductor material 22 is removed from the levels 18 during the formation of the cavities 30. Remaining regions of the semiconductor material 22 define lateral peripheries 32 of the cavities, with such lateral peripheries being distal from the opening 28.

Figure 8:
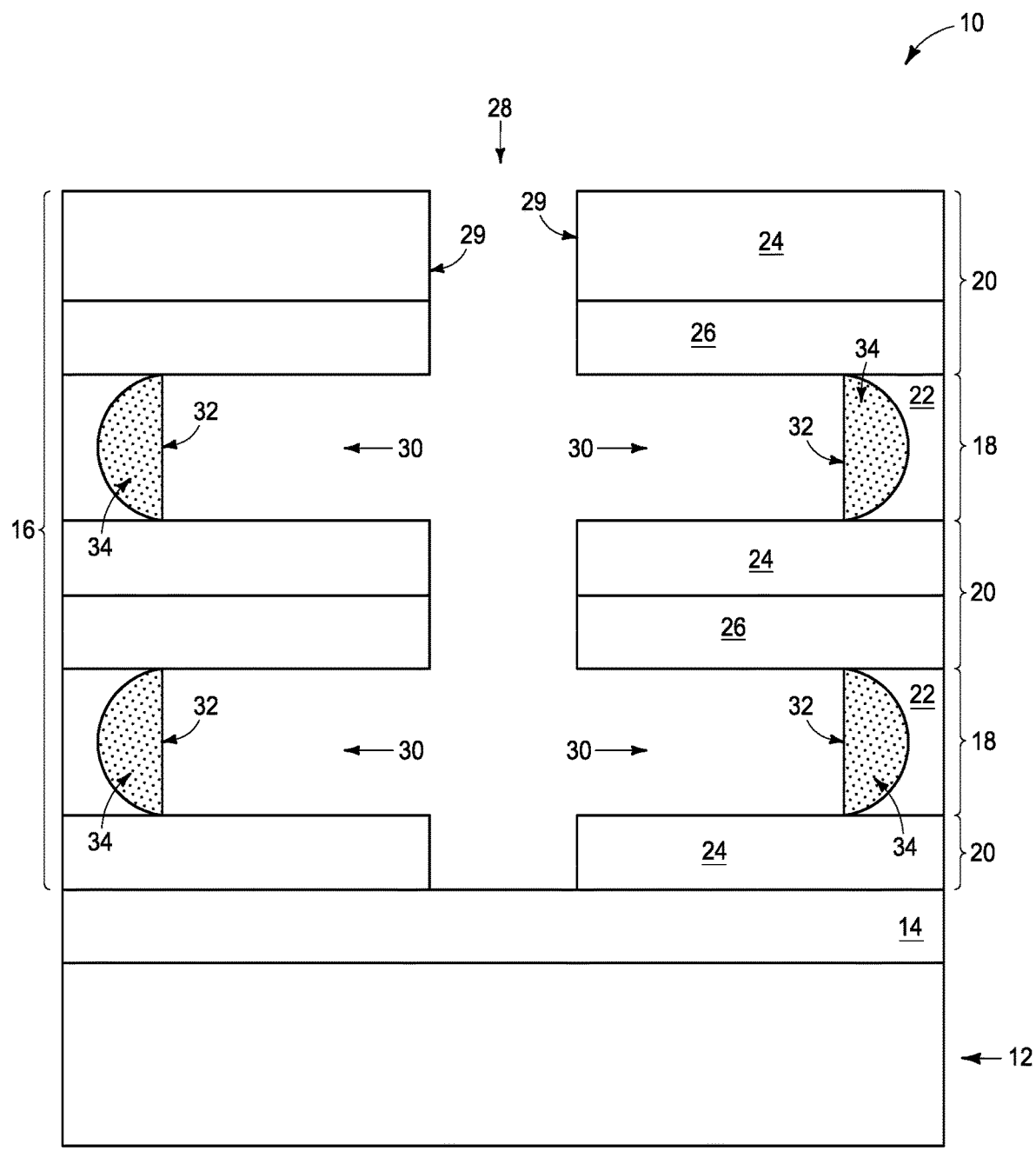

Referring to FIG. 8, dopant is flowed into the opening 28 and along the cavities 30 to dope regions of the semiconductor material 22, and to thereby form source/drain regions 34 along the lateral peripheries 32. The dopant within the source/drain regions 34 is diagrammatically illustrated with stippling to assist the reader in visualizing the source/drain regions. The source/drain regions 34 may be analogous to the regions 1240 and 1340 described above with reference to FIGS. 1-4.

The dopant may comprise any suitable composition(s). In some embodiments, the dopant may comprise one or both of phosphorus and arsenic, the semiconductor material 22 may comprise silicon, and the source/drain regions 34 may correspond to n-type doped regions.

Figure 9:
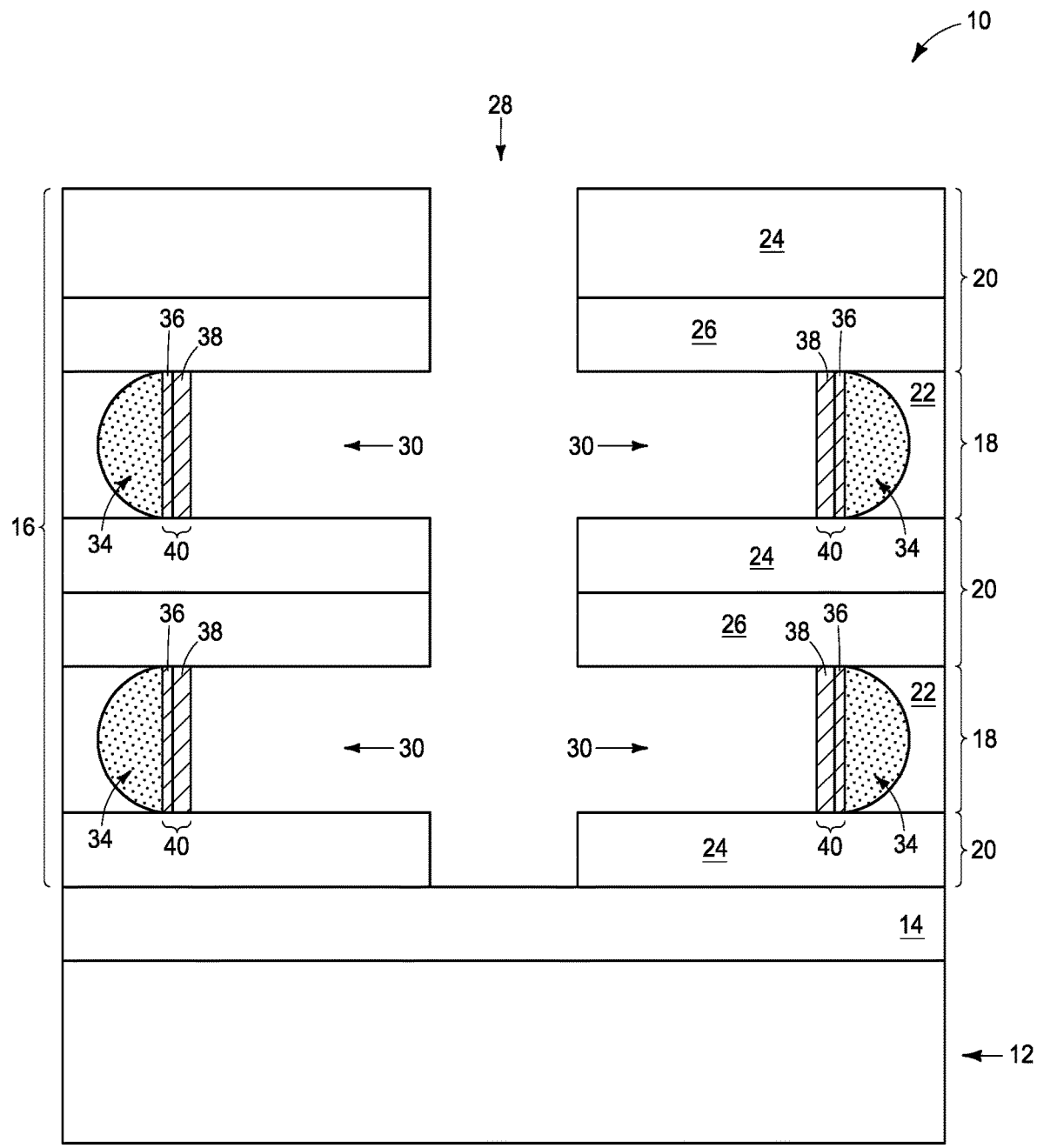

Referring to FIG. 9, metal is combined with exposed portions of the semiconductor material 22 within the cavities 30 to form a first metal-containing composition 36 directly adjacent to the source/drain regions 34, and then a second metal-containing composition 38 is formed directly adjacent to the first metal-containing composition 36. In some embodiments, the first metal-containing composition 36 may be considered to be formed along semiconductor material 22 at the lateral peripheries 32 (labeled in FIG. 8) of the cavities 30.

The first metal-containing composition 36 may comprise a combination of metal and the semiconductor material 22. For instance, in some embodiments the semiconductor material 22 may comprise silicon, and the first metal-containing composition 36 may comprise, consist essentially of, or consist of metal silicide (e.g., titanium silicide, tungsten silicide, etc.). In some embodiments, the first metal-containing composition may be considered to comprise, consist essentially of, or consist of one or both of WSi and TiSi, where the chemical formulas indicate primary constituents rather than specific stoichiometries.

The second metal-containing composition 38 may comprise the same metal as the first metal-containing composition 36. In some embodiments, the second metal-containing composition 38 may comprise, consist essentially of, or consist of one or both of tungsten and titanium.

The metal-containing compositions 36 and 38 may be formed by flowing metal-containing precursor (e.g., metal halide) into the opening 28 and along the cavities 30.

The first and second metal-containing compositions 36 and 38 may be considered to form conductive bridges 40.

Figure 10:
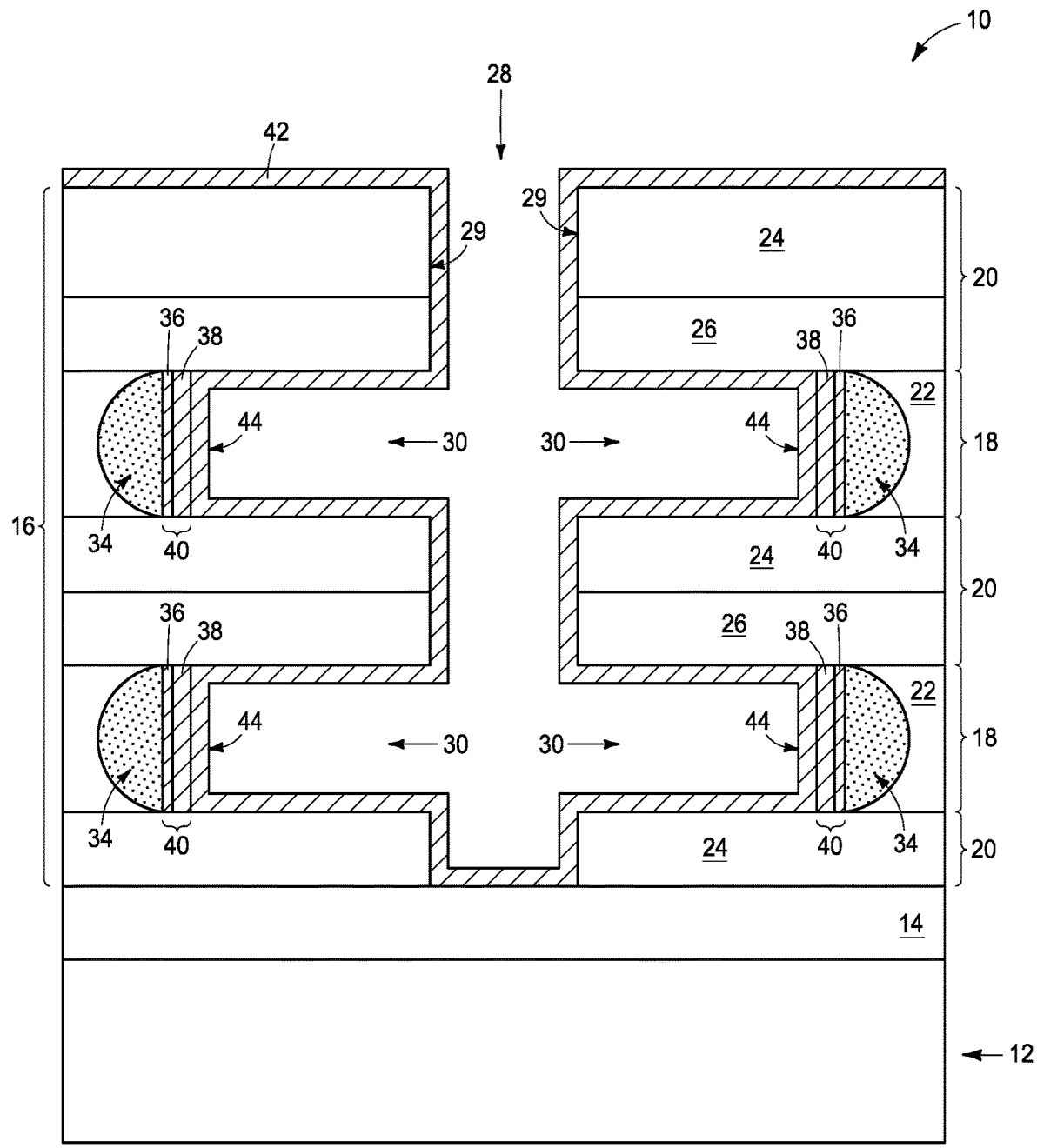

Referring to FIG. 10, a first capacitor electrode material 42 is formed across the assembly 10. The first capacitor electrode material lines the opening 28, and lines the cavities 30. Regions 44 of the first capacitor electrode material 42 are directly adjacent to the metal-containing material 38 of the conductive bridges 40.

The first capacitor electrode material 42 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first capacitor electrode material 42 may comprise, consist essentially of, or consist of metal nitride (e.g., titanium nitride).

Figure 11:
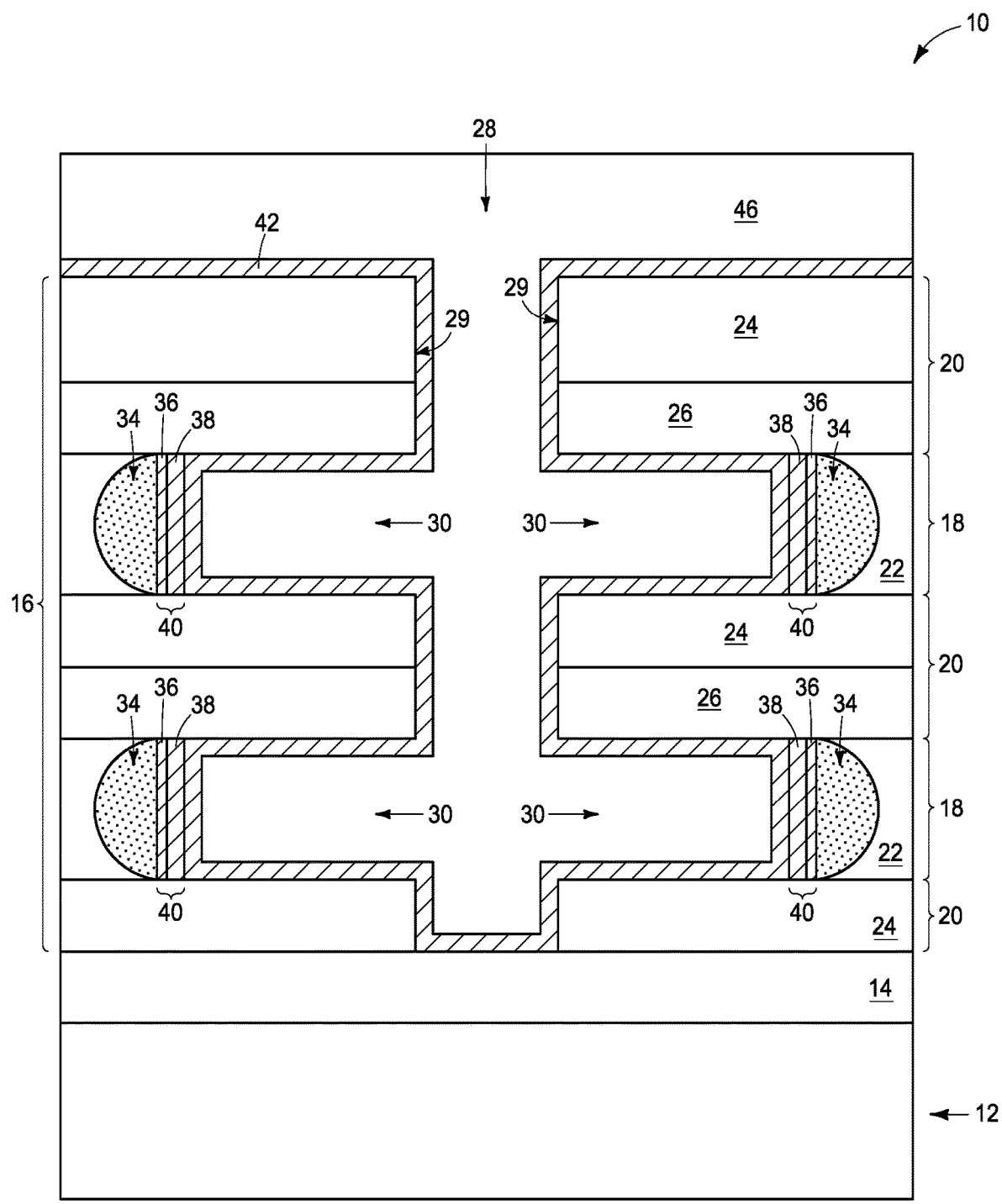

Referring to FIG. 11, sacrificial material 46 is formed within the opening 28, and within the cavities 30. The sacrificial material 46 may comprise any suitable composition(s), and in some embodiments may comprise, consist essentially of, or consist of silicon (e.g., one or both of polycrystalline silicon and amorphous silicon).

Figure 12:
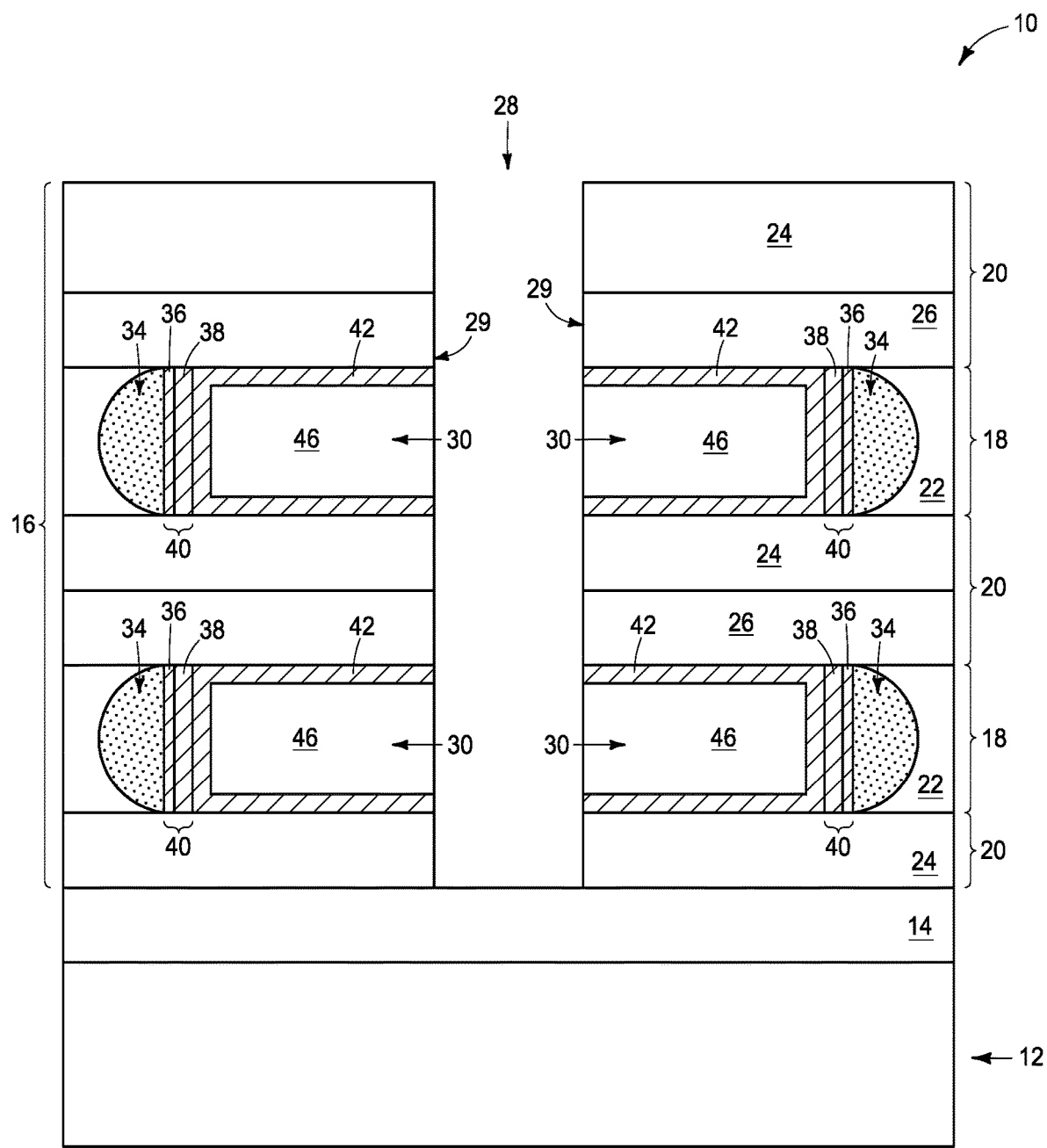

Referring to FIG. 12, the opening 28 is reestablished with one or more suitable etches. Such removes excess material 42 from along the sidewalls 29 of the opening 28. The sacrificial material 46 functions as a protective material which protects the material 42 within the cavities 30.

Figure 13:
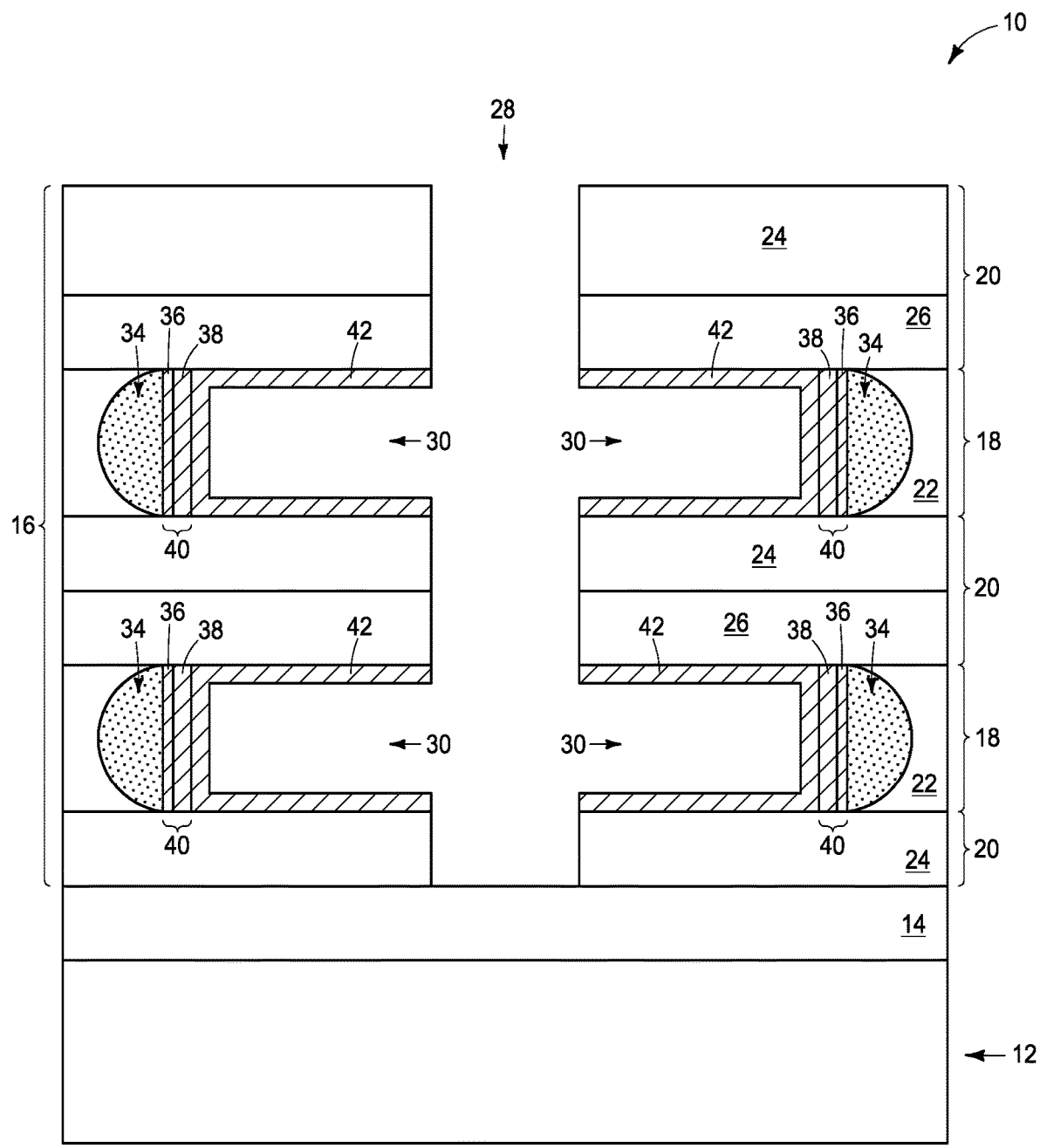

Referring to FIG. 13, the material 46 (FIG. 12) is removed from within the cavities 30.

Figure 14:
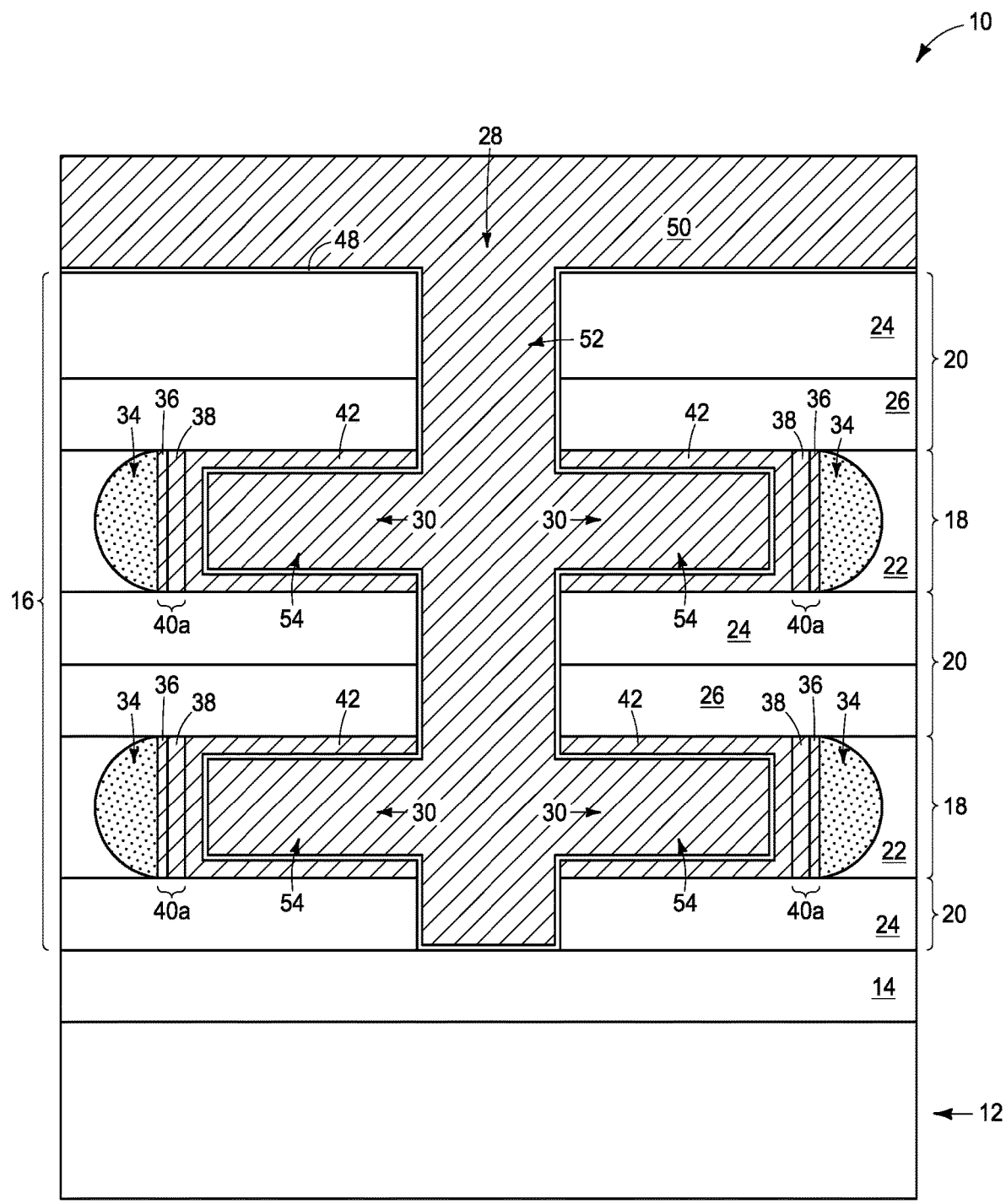

Referring to FIG. 14, capacitor dielectric material 48 is formed within the opening 28, and within the cavities 30. The capacitor dielectric material may be considered to narrow the cavities. Subsequently, second capacitor electrode material 50 is formed within the opening 28, and within the narrowed cavities 30. The second capacitor electrode material 50 fills the narrowed cavities.

In some embodiments, the second capacitor electrode material 50 within the opening 28 may be considered to be configured as a column 52 which extends vertically through the stack 16, and such column may be considered to be joined with regions 54 of the second capacitor electrode material 50 that extend laterally within the cavities 30.

The capacitor dielectric material 48 may comprise any suitable composition(s). In some embodiments, the capacitor dielectric material 48 may comprise, consist essentially of, or consist of silicon dioxide. In some embodiments, the capacitor dielectric material 48 may comprise, consist essentially of, or consist of one or more high-k compositions (e.g., aluminum oxide, zirconium oxide, hafnium oxide, etc.); where the term high-k means a dielectric constant greater than that of silicon dioxide (i.e., greater than about 3.9).

The second electrode material 50 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the second electrode material 50 may comprise, consist essentially of, or consist of one or more metals. For instance, the second electrode material 50 may comprise, consist essentially of, or consist of tungsten.

Figure 15:
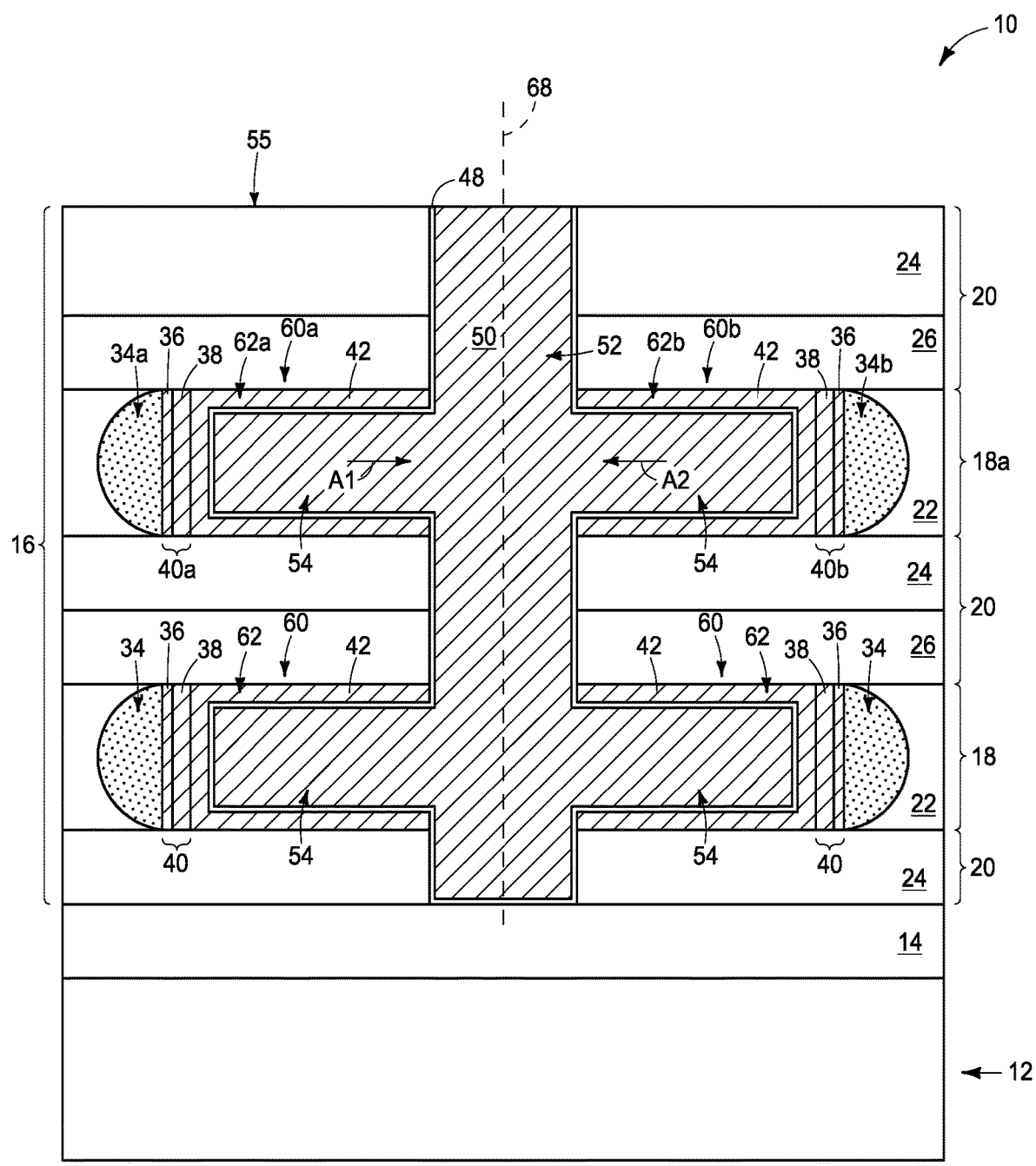

Referring to FIG. 15, a planarization process is utilized to remove excess materials 48 and 50 from over the upper surface of the stack 16, and to thereby form a planarized upper surface 55 extending across the upper surface of the stack 16. The planarization process may comprise, for example, chemical-mechanical polishing (CMP).

The configuration of FIG. 15 comprises capacitors 60 along the levels 18. Each of the capacitors comprises the electrode material 42 configured as a container-shaped first electrode 62, a region of the capacitor dielectric material 48, and a region of the capacitor electrode material 50. In some embodiments, the capacitor electrode material 50 may be considered to be configured as a shared capacitor electrode, in that it is shared between laterally-adjacent capacitors within the levels 18. For instance, one of the levels 18 is labeled 18a in FIG. 15, and such level comprises a pair of laterally-adjacent capacitors labeled 60a and 60b. The capacitors 60a and 60b comprise capacitor electrodes labeled as 62a and 62b, respectively. The capacitor electrodes 62a and 62b may be referred to as first and second capacitor electrodes, respectively. The first and second capacitor electrodes 62a and 62b are laterally-extending container-shaped electrodes. The container-shaped first electrode 62a opens along a first lateral direction A1, and the container-shaped second electrode 62b opens along a second lateral direction A2 which is opposite to the first lateral direction A1.

The capacitor dielectric material 48 lines interior surfaces of the container-shaped first and second capacitor electrodes 62a and 62b. The shared capacitor electrode of material 50 extends vertically between the first and second capacitor electrodes 62a and 62b, and regions 54 of the shared capacitor electrode extend into the openings of the container-shaped first and second capacitor electrodes 62a and 62b. The shared capacitor electrode material 50 is spaced from the capacitor electrodes 62a and 62b by the capacitor dielectric material 48.

In the illustrated embodiment, the first and second capacitors 60a and 60b are laterally offset from one another, and are substantially mirror-images of one another along a plane 68 that extends vertically through a center of the column 52 of the shared electrode material 50. The term "substantial mirror-image" means a mirror-image to within reasonable tolerances of fabrication and measurement.

The source/drain regions 34 along the level 18a are labeled as 34a and 34b. The regions 34a and 34b may be referred to as first and second source/drain regions, respectively. Such first and second source/drain regions are laterally offset from one another.

The conductive bridges 40 within the level 18a are labeled 40a and 40b, respectively. The conductive bridge 40a electrically couples the electrode 62a of the first capacitor 60a with the first source/drain region 34a, and the conductive bridge 40b electrically couples the electrode 62b of the second capacitor 60b with the second source/drain region 34b.

In some embodiments, the capacitors 60 of FIG. 15 may be incorporated into three-dimensional memory arrays of the types described above with reference to FIGS. 1-4. The capacitors 60 may be within memory cells of the memory array, and may be analogous to the capacitors 1208 and 1308 of FIGS. 1-4. In some embodiments, the capacitors 60 may be within memory arrays comprising vertically-extending digit lines analogous to the digit lines 1312 described with reference to FIGS. 3 and 4, and in some embodiments the capacitors 60 may be within memory arrays comprising vertically-extending wordlines analogous to the wordlines 1214 described with reference to FIGS. 1 and 2.

In some embodiments, the illustrated capacitors 60 along each of the levels 18 may be referred to as paired capacitors in that they share a common plate electrode (i.e., the plate electrode comprising the electrode material 50). The capacitors 60a and 60b along the level 18a may be considered to correspond to a set of the paired capacitors, and similarly the paired capacitors 60 along other levels 18 may be considered to be other sets of paired capacitors.

In some embodiments, the paired capacitors 60a and 60b may be considered together as a capacitor assembly along the level 18a. Such capacitor assembly is one of many substantially identical capacitor assemblies, with the capacitor assemblies being along the first levels 18. In some embodiments, the first levels 18 may be referred to as capacitor assembly levels (or as capacitor-containing levels). There may be any suitable number of such capacitor assembly levels within a three-dimensional memory device (e.g., a device analogous to any of the prior art devices of FIGS. 1-4). In some embodiments there may be at least eight of the capacitor assembly levels 18, at least 16 of the capacitor assembly levels 18, at least 32 of the capacitor assembly levels 18, at least 64 of the capacitor assembly levels 18, at least 128 of the capacitor assembly levels 18, at least 256 of the capacitor assembly levels 18, at least 512 of the capacitor assembly levels 18, etc.

An advantage of the embodiments described herein is that the conductive bridges 40 may provide highly conductive connections between the source/drain regions 34 and the electrodes 62 of the capacitors 60, which may improve performance (e.g., access speed) of memory devices formed in accordance with embodiments described herein as compared to conventional memory devices.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first source/drain region and having a second source/drain laterally offset from the first source/drain region. The first and second source/drain regions include conductively-doped silicon. Metal silicide material is directly adjacent to lateral surfaces of the first and second source/drain regions. Metal-containing regions are directly adjacent to the metal silicide material. One of the metal-containing regions is a first metal-containing region and is associated with the first source/drain region, and another of the metal-containing regions is a second metal-containing region and is associated with the second source/drain region. A laterally-extending container-shaped first capacitor electrode is coupled with the first metal-containing region, with said container shape of the first capacitor electrode opening along a first lateral direction. A laterally-extending container-shaped second capacitor electrode is coupled with the second metal-containing region, with said container shape of the second capacitor electrode opening along a second lateral direction which is opposite to the first lateral direction. Capacitor dielectric material lines interior surfaces of the first and second capacitor electrodes, A shared capacitor electrode extends vertically between the first and second capacitor electrodes, and extends into the lined first and second capacitor electrodes. The shared capacitor electrode, the capacitor dielectric material, and the first capacitor electrode are together incorporated into a first laterally-extending capacitor. The shared capacitor electrode, the capacitor dielectric material, and the second capacitor electrode are together incorporated into a second laterally-extending capacitor, with the second laterally-extending capacitor being laterally offset from the first laterally-extending capacitor.

Some embodiments include an integrated assembly comprising a column of shared capacitor electrode material extending vertically through a stack of alternating first and second levels. The first levels are capacitor-containing levels and comprise paired laterally-extending capacitors. Each set of the paired capacitors includes a first capacitor and a second capacitor, with the second capacitor being substantially a mirror-image of the first capacitor along a plane which extends vertically through a center of the column of the shared electrode material. The capacitors include container-shaped electrodes which are coupled with source/drain regions associated with access devices. The coupling to the source/drain regions occurs through conductive bridges which include metal-containing regions and metal-silicide-containing regions. The metal-containing regions are directly against the container-shaped electrodes, and the metal-silicide-containing regions are directly against the source/drain regions. The second levels are insulative levels comprising one or more insulative materials.

Some embodiments include a method of forming an integrated assembly. A stack of alternating first and second levels is formed. The first levels comprise semiconductor material and the second levels comprise insulative material. An opening is formed to extend through the stack. The semiconductor material of the first levels is recessed to form laterally-extending cavities adjacent the opening. Remaining regions of the semiconductor material define lateral peripheries of the cavities distal from the opening. The semiconductor material along the lateral peripheries of the cavities is doped. Metal is combined with exposed portions of the semiconductor material along the lateral peripheries of the cavities to form a first metal-containing composition along the lateral peripheries. A second metal-containing composition is formed along the first metal-containing composition. The first and second metal-containing compositions together form conductive bridges. The cavities are lined with first capacitor electrode material. Regions of the first capacitor electrode material are directly against the conductive bridges. Capacitor dielectric material is formed within the lined cavities to narrow the cavities. Second capacitor electrode material is formed within the narrowed cavities to fill the cavities. A column of the second capacitor electrode material is formed within the opening and is joined with the second capacitor electrode material within the cavities.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first source/drain region, and a second source/drain laterally offset from the first source/drain region;
   first and second metal compositions directly adjacent respective lateral surfaces of the first and second source/drain regions;
   a laterally-extending first capacitor electrode coupled with the first metal composition;
   a laterally-extending second capacitor electrode coupled with the second metal composition;
   capacitor dielectric material lining the first and second capacitor electrodes; and
   a shared capacitor electrode extending between the first and second capacitor electrodes and incorporated into respective first and second laterally-extending capacitors.

2. The integrated assembly of claim 1 wherein the first and second capacitor electrodes comprise metal nitride.

3. The integrated assembly of claim 1 wherein the first and second capacitor electrodes comprise titanium nitride.

4. The integrated assembly of claim 1 wherein the first and second metal compositions comprise tungsten.

5. The integrated assembly of claim 1 wherein the first and second metal compositions comprise metal silicide.

6. The integrated assembly of claim 1 wherein the first and second metal compositions comprise titanium.

7. The integrated assembly of claim 1 comprising a memory array, and wherein the first and second capacitors are within first and second memory cells of the memory array.

8. An integrated assembly, comprising:
   a column of shared capacitor electrode material extending vertically through a stack of alternating first and second levels;
   the first levels being capacitor-containing levels and comprising paired laterally-extending capacitors; each set of the paired capacitors including a first capacitor and a second capacitor; the first and second capacitors comprising electrodes coupled with source/drain regions associated with access devices; the coupling to the source/drain regions occurring through conductive bridges which include a metal-containing region; and the second levels being insulative levels comprising one or more insulative materials.

9. The integrated assembly of claim 8 wherein the metal-containing region is being directly against the electrodes.

10. The integrated assembly of claim 8 wherein the metal-containing region comprises tungsten silicide and/or titanium silicide.

11. The integrated assembly of claim 8 wherein the metal-containing region comprises tungsten and/or titanium.

12. The integrated assembly of claim 8 wherein the insulative levels comprise silicon dioxide and silicon nitride.

13. The integrated assembly of claim 8 wherein the metal-containing region comprises a first metal layer and a second metal layer discrete from the first metal layer.

14. The integrated assembly of claim 8 wherein the first and second metal layers comprise the same metal.

15. An integrated assembly, comprising:
a first access device laterally offset from a second access device;
a capacitor electrode extending between the first and second access devices and incorporated into respective first and second laterally-extending capacitors; and
a first conductive interconnect coupling the first access device to the first laterally-extending capacitor and a second conductive interconnect coupling the second access device to the second laterally-extending capacitor.

16. The integrated assembly of claim 15 wherein the first and second conductive interconnects directly contact respective first and second access devices.

17. The integrated assembly of claim 15 wherein the first and second conductive interconnects directly contact respective first and second laterally-extending capacitors.

18. The integrated assembly of claim 15 wherein at least one of the first and second conductive interconnects comprises a least two discrete layers.

19. The integrated assembly of claim 18 wherein the at least two discrete layers comprise the same metal.

20. The integrated assembly of claim 18 wherein the at least two discrete layers comprise different compositions.

21. The integrated assembly of claim 20 wherein the at least two discrete layers comprise the same metal.

* * * * *